(12) United States Patent
Hardy et al.

(10) Patent No.: US 12,150,232 B2
(45) Date of Patent: Nov. 19, 2024

(54) EMBEDDED VOLTAGE MULTIPLIER FOR AN X-RAY SOURCE

(71) Applicant: Moxtek, Inc., Orem, UT (US)

(72) Inventors: Scott Howard Hardy, Riverton, UT (US); Vincent F. Jones, Cedar Hills, UT (US); Bob West, Orem, UT (US)

(73) Assignee: Moxtek, Inc., Orem, UT (US)

( * ) Notice: Subject to any disclaimer, the term of this patent is extended or adjusted under 35 U.S.C. 154(b) by 450 days.

(21) Appl. No.: 17/824,026

(22) Filed: May 25, 2022

(65) Prior Publication Data

US 2022/0408536 A1 Dec. 22, 2022

Related U.S. Application Data

(60) Provisional application No. 63/211,684, filed on Jun. 17, 2021.

(51) Int. Cl.
*H05G 1/00* (2006.01)
*H05G 1/10* (2006.01)
*H05K 1/14* (2006.01)

(52) U.S. Cl.
CPC ............... *H05G 1/10* (2013.01); *H05K 1/144* (2013.01)

(58) Field of Classification Search
CPC ......................................................... H05G 1/10
See application file for complete search history.

(56) References Cited

U.S. PATENT DOCUMENTS

| | | |
|---|---|---|
| 7,839,254 B2 | 11/2010 | Moxtek |
| 8,903,047 B1 | 12/2014 | Moxtek |
| 9,087,670 B2 | 7/2015 | Moxtek |
| 2019/0348249 A1* | 11/2019 | Hoffman ................. H05G 1/06 |

* cited by examiner

*Primary Examiner* — Dani Fox
(74) *Attorney, Agent, or Firm* — Thorpe North & Western, LLP

(57) ABSTRACT

A high voltage power supply can be compact with shielded electronic components. The power supply can include multiple stages separated by circuit boards. Electronic components for each stage can be directly soldered to adjacent circuit boards. Traces can pass through and electrically couple electronic components on each side of the circuit board between them.

20 Claims, 8 Drawing Sheets

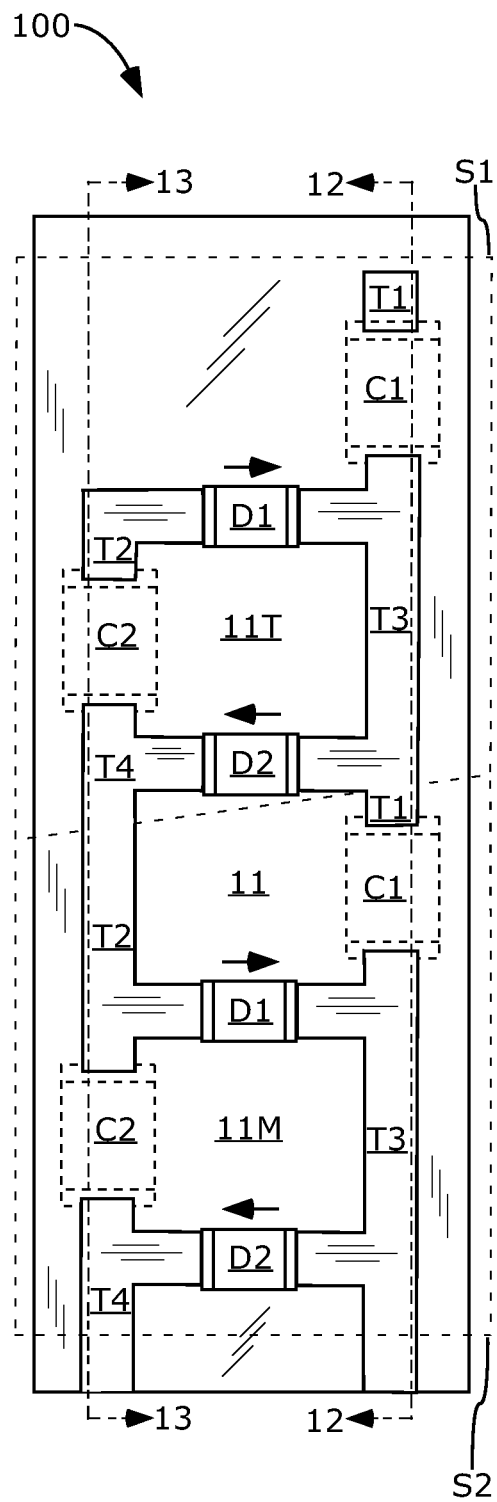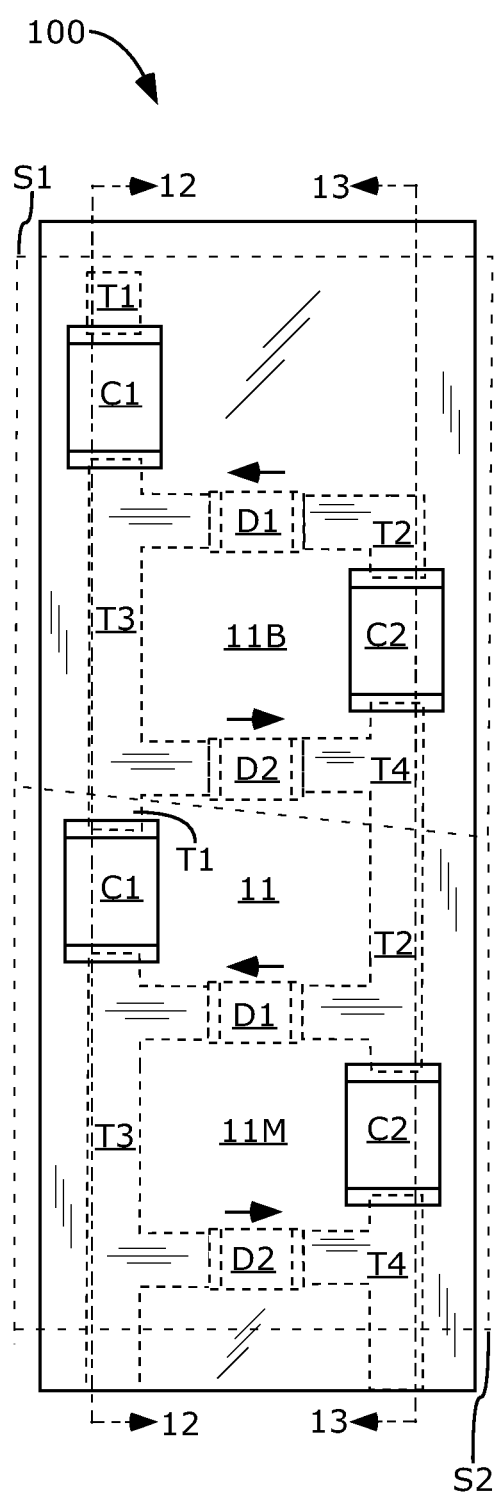
*Figure 10*     *Figure 11*

EMBEDDED VOLTAGE MULTIPLIER FOR AN X-RAY SOURCE

CLAIM OF PRIORITY

This application claims priority to U.S. Provisional Patent Application No. 63/211,684, filed on Jun. 17, 2021, which is incorporated herein by reference.

FIELD OF THE INVENTION

The present application is related to x-ray sources.

BACKGROUND

High voltage power supplies can provide a large bias voltage, such as for example tens of kilovolts. X-ray sources can use high voltage power supplies.

A large voltage between a cathode and an anode of the x-ray tube, and sometimes a heated filament, can cause electrons to emit from the cathode to the anode. The anode can include a target material. The target material can generate x-rays in response to impinging electrons from the cathode.

BRIEF DESCRIPTION OF THE DRAWINGS (DRAWINGS MIGHT NOT BE DRAWN TO SCALE)

Figure 2:
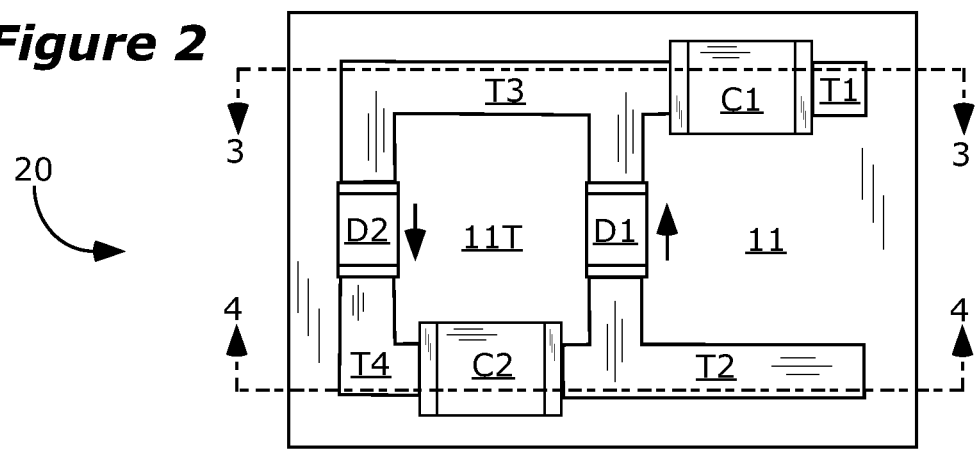
FIG. 2 is a top-view of a stage 20 of a power supply with electronic components C1, C2, D1, D2 arranged as a mirror-image of the electronic components C1, C2, D1, D2 in stage 10.
Figure 3:
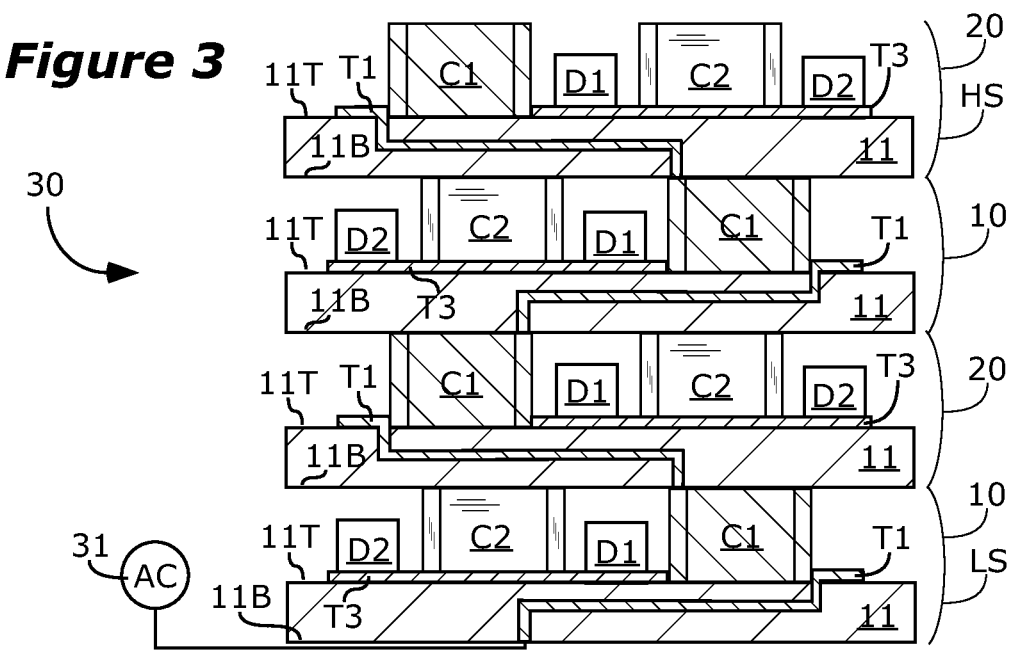

FIG. 3 is a cross-sectional side-view of power supply 30 with multiple stages 10 and 20 alternated in a stack. The cross-sectional side-view of each stage 10 and 20 is taken along line 3-3 in FIGS. 1-2.

Figure 4:
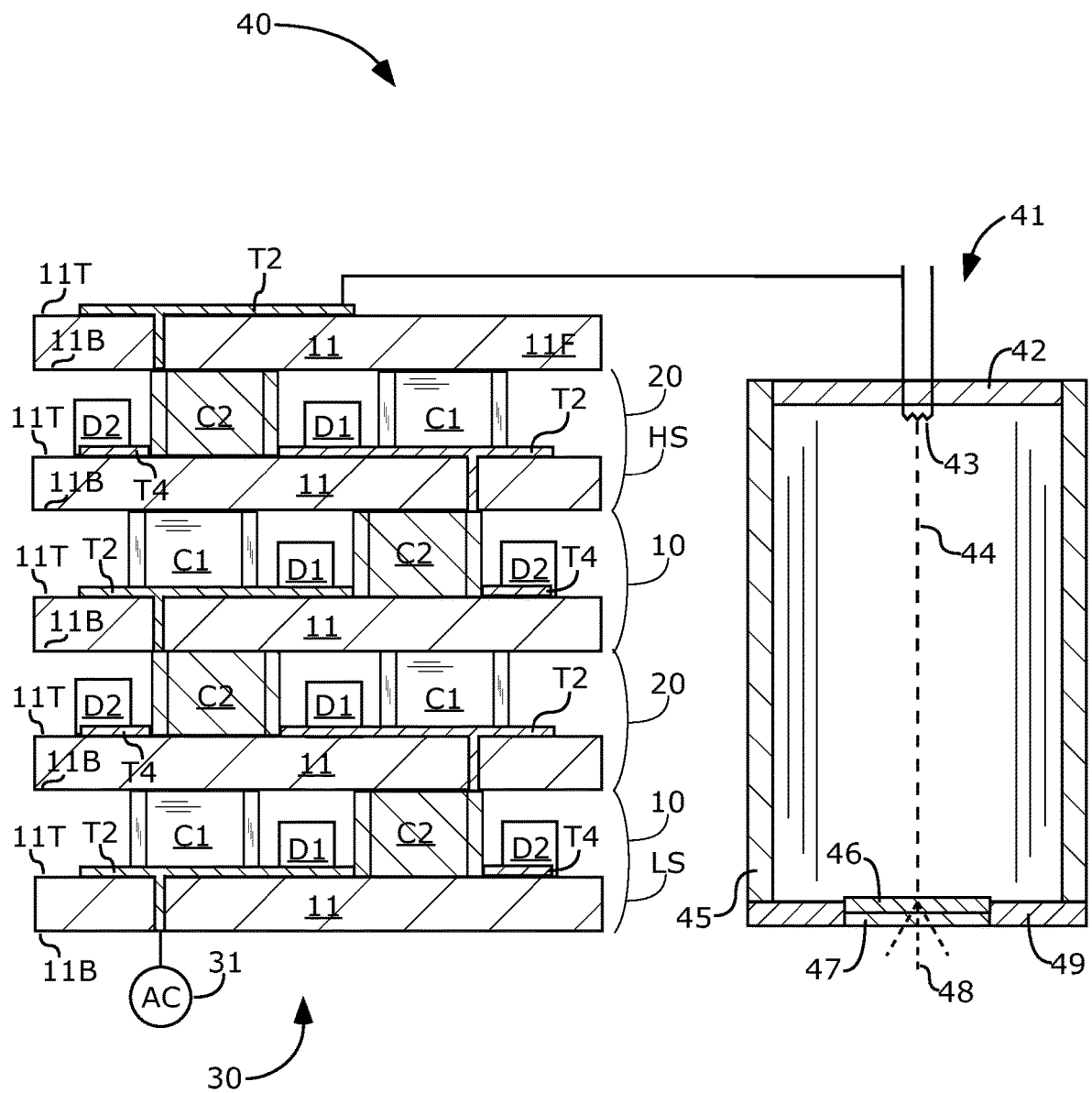

FIG. 4 is a cross-sectional side-view of an x-ray source 40 with an x-ray tube 41 electrically-coupled to the power supply 30 of FIG. 3. FIG. 4 shows an opposite side of the stack from the view in FIG. 3. The cross-sectional side-view of each stage 10 and 20 is taken along line 4-4 in FIGS. 1-2.

Figure 5:
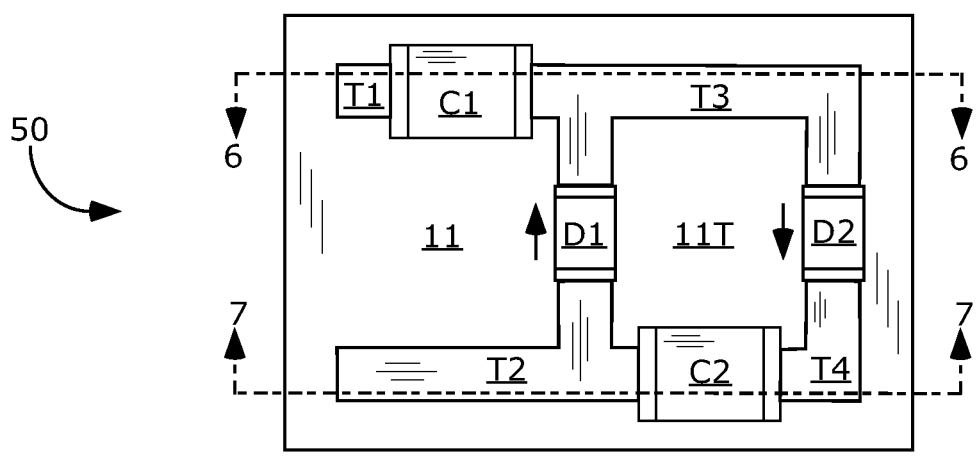

FIG. 5 is a top-view of a stage 50 of a power supply with electronic components C1, C2, D1, D2 on a top-side 11T of a circuit board 11.

Figure 6:
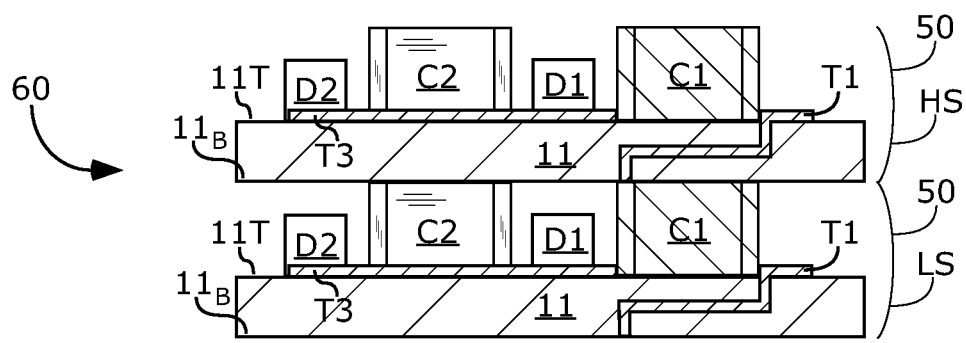

FIG. 6 is a cross-sectional side-view of a power supply 60 with multiple stages 50. The cross-sectional side-view of each stage 50 is taken along line 6-6 in FIG. 5.

Figure 7:
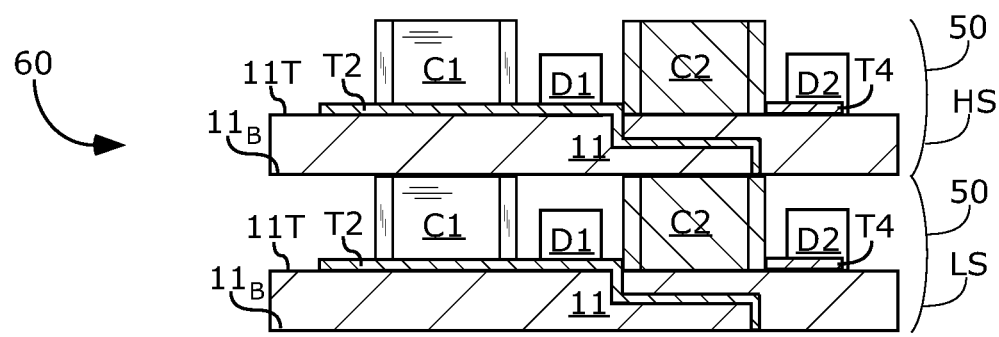

FIG. 7 is a cross-sectional side-view of the power supply 60 of FIG. 6. FIG. 7 shows an opposite side of the power supply 60. The cross-sectional side-view of each stage 50 is taken along line 7-7 in FIG. 5.

Figure 8:
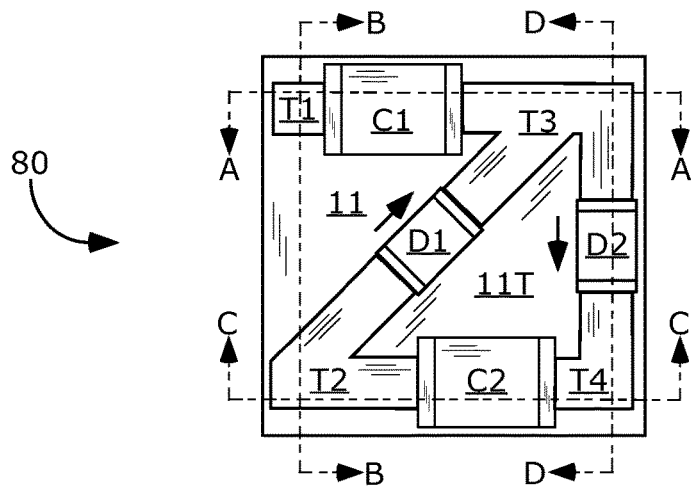

FIG. 8 is a top-view of a stage 80 of a power supply with electronic components C1, C2, D1, D2 on a top-side 11T of a circuit board 11.

Figure 9:
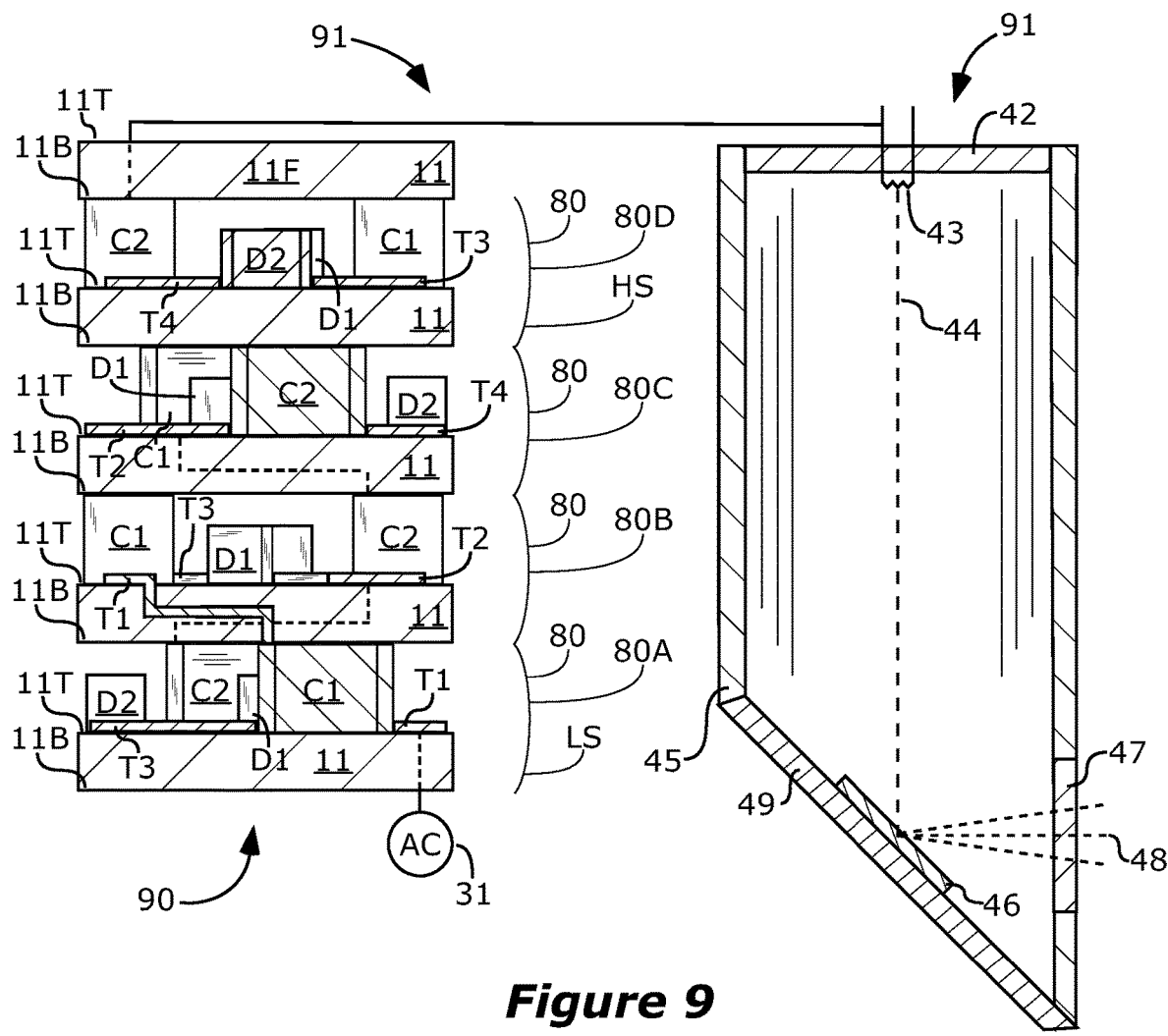

FIG. 9 is a cross-sectional side-view of an x-ray source 91 with an x-ray tube 41 electrically-coupled to a power supply 90. The power supply 90 includes multiple stages 80A, 80B, 80C, and 80D. The cross-sectional side-view in FIG. 9 for stage 80A is taken along line A-A, for stage 80B is taken along line B-B, for stage 80C is taken along line C-C, and for stage 80D is taken along line D-D in FIG. 8.

FIG. 10 is a top-view of a stage 100 for a power supply with electronic components D1 and D2 and traces T1, T2, T3, and T4 on a top-side 11T of a middle circuit board 11M.

FIG. 11 is a bottom-view of the stage 100 with electronic components C1 and C2 on a bottom-side 11B of the middle circuit board 11M.

Figure 12:
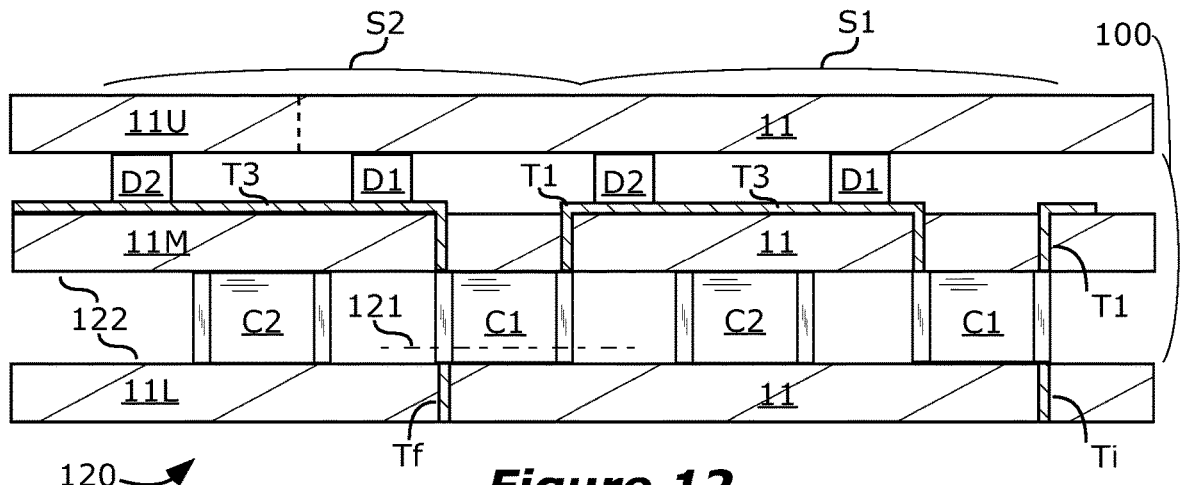

FIG. 12 is a cross-sectional side-view of power supply 120 with some electronic components C1 and C2 (see FIG. 11) sandwiched between a lower circuit board 11L and the middle circuit board 11M; and other electronic components D1 and D2 (see FIG. 12) sandwiched between an upper circuit board 11U and the middle circuit board 11M.

Figure 13:
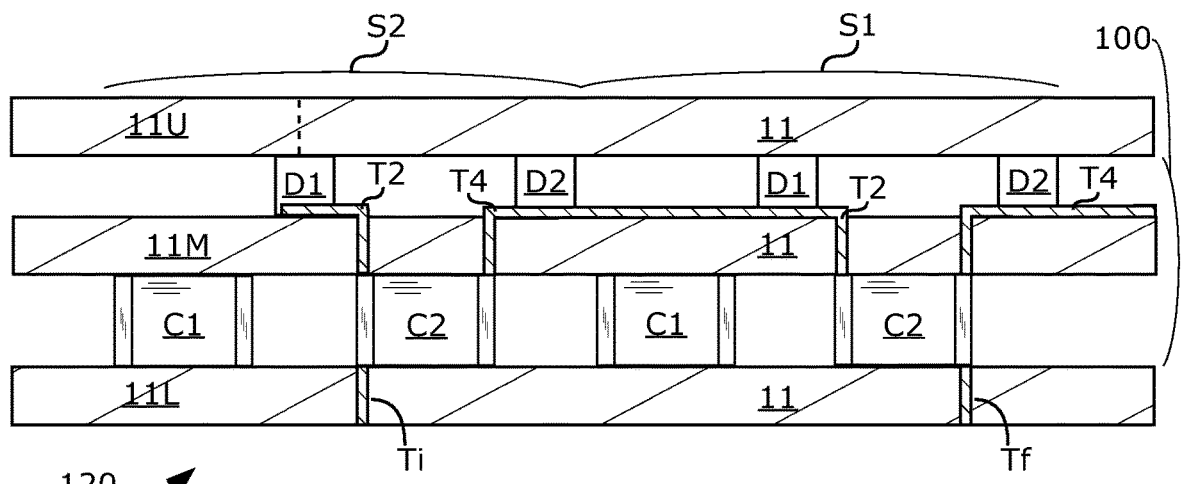

FIG. 13 is a cross-sectional side-view of an opposite side of the power supply 120 of FIG. 12.

Figure 14:
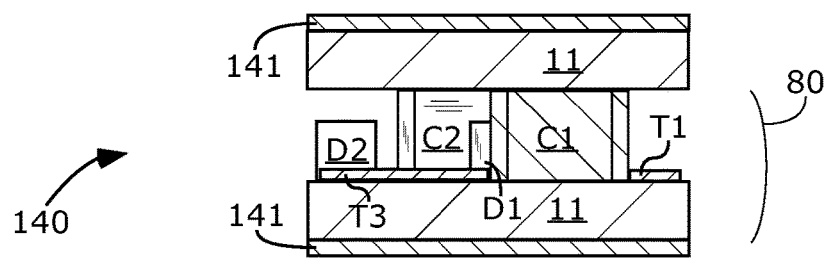

FIG. 14 is a cross-sectional side-view of a power supply 140 with electronic components C1, C2, D1, and D2 sandwiched between and adjoining a pair of circuit boards 11. The electronic components C1, C2, D1, and D2 and the pair of circuit boards 11 are sandwiched between a pair of metal sheets 141.

Figure 15:
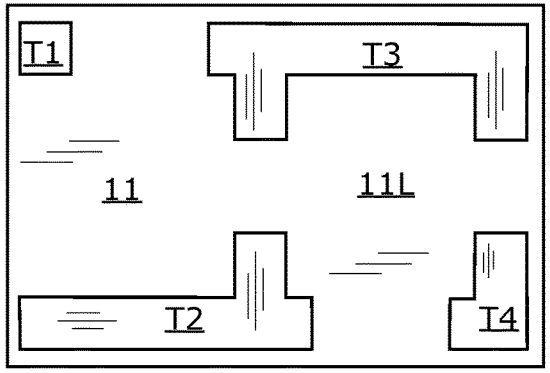

FIG. 15 is a cross-sectional side-view illustrating a step 150 in a method of making a high-voltage power supply, including providing a lower circuit board 11L with traces T1, T2, T3, and T4.

Figure 16:
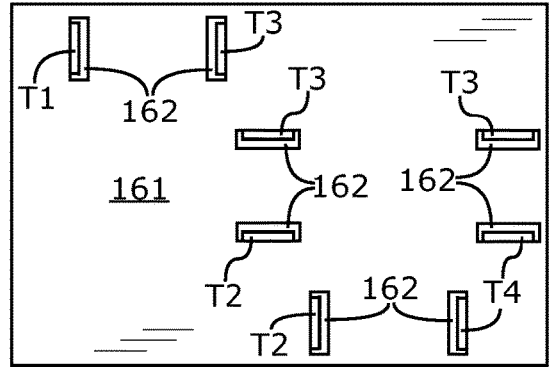

FIG. 16 is a cross-sectional side-view illustrating a step 160 in a method of making a high-voltage power supply, which can follow step 150, including applying a lower solder mask 161 on the lower circuit board 11L.

Figure 17:
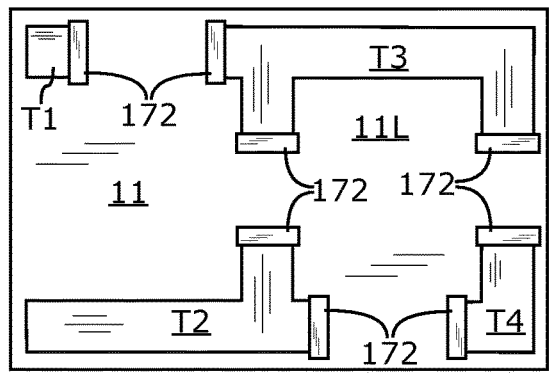

FIG. 17 is a cross-sectional side-view illustrating a step 170 in a method of making a high-voltage power supply, which can follow step 160, including applying solder-paste 172 on the lower circuit board 11L at openings in the lower solder mask 161, then removing the lower solder mask 161.

Figure 18:
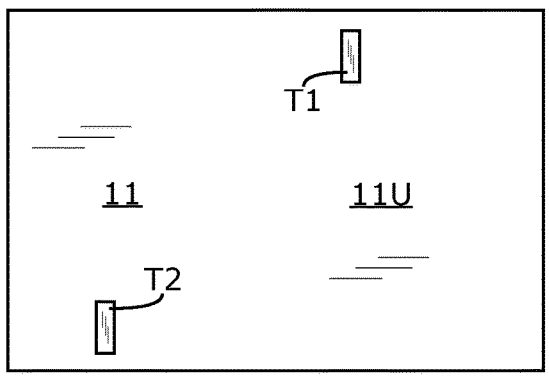

FIG. 18 is a cross-sectional side-view illustrating a step 180 in a method of making a high-voltage power supply, including providing an upper circuit board 11U with traces T1 and T2.

Figure 19:
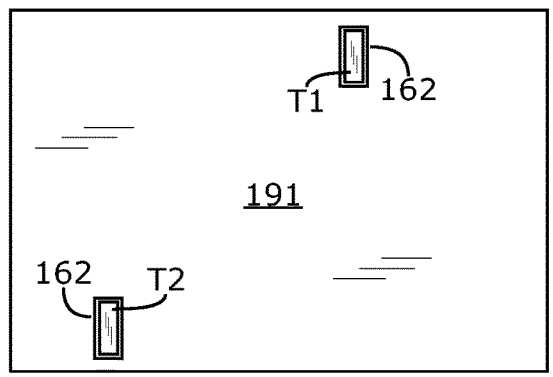

FIG. 19 is a cross-sectional side-view illustrating a step 190 in a method of making a high-voltage power supply, which can follow step 180, including applying an upper solder mask 191 on the upper circuit board 11U.

Figure 20:
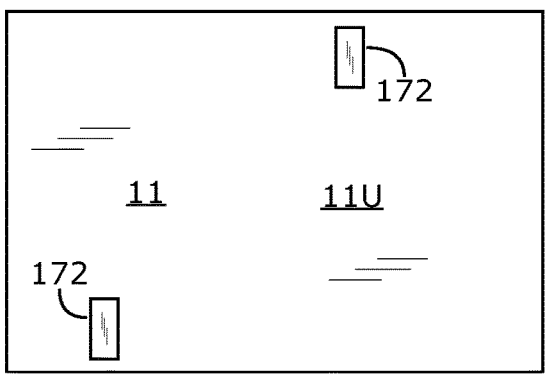

FIG. 20 is a cross-sectional side-view illustrating a step 200 in a method of making a high-voltage power supply, which can follow step 190, including applying solder-paste 172 on the upper circuit board 11U at openings in the upper solder mask 191, then removing the upper solder mask 191.

Figure 21:
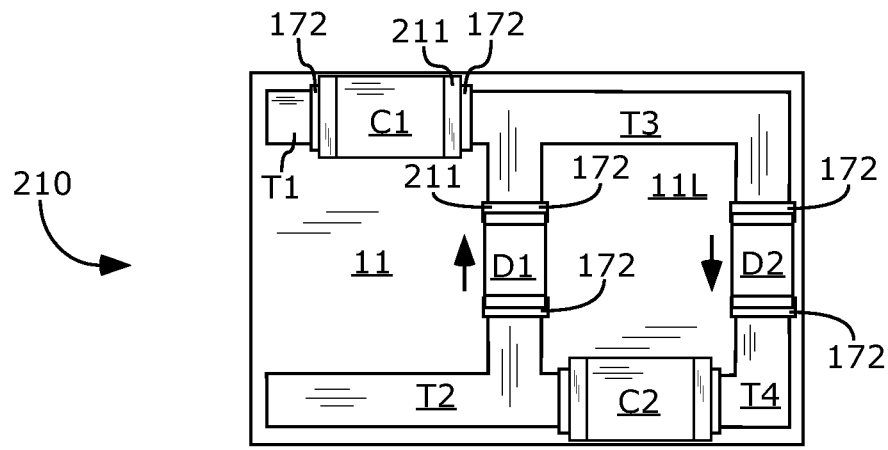

FIG. 21 is a cross-sectional side-view illustrating a step 210 in a method of making a high-voltage power supply, which can follow step 170, including placing electronic components C1, C2, D1, D2 on the lower circuit board 11L. The electronic components C1, C2, D1, and D2 have electrical connections 211. At least some of the electrical connections 211 are placed on the solder-paste 172 of the lower circuit board 11L.

Figure 22:
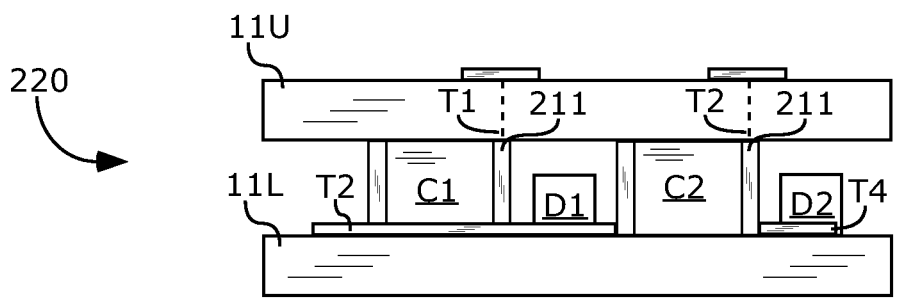

FIG. 22 is a cross-sectional side-view illustrating a step 220 in a method of making a high-voltage power supply, which can follow steps 200 and 210, including placing the upper circuit board 11U on the electronic components C1, C2, D1, and D2 with the solder-paste 172 of the upper circuit board 11U on at least some of the electrical connections 211.

Figure 23:
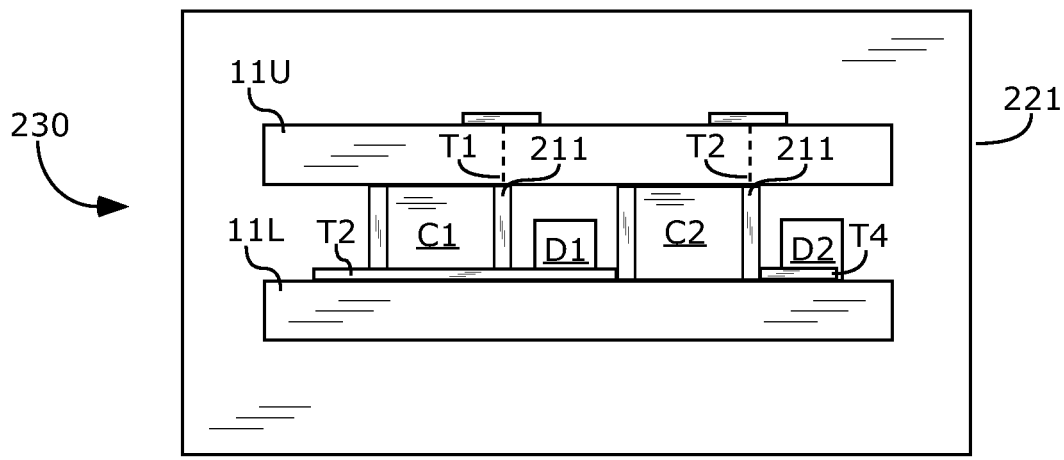

FIG. 23 is a cross-sectional side-view illustrating a step 230 in a method of making a high-voltage power supply, which can follow step 220. This step 230 includes heating and cooling the lower circuit board 11L, the upper circuit board 11U, the electronic components C1, C2, D1, and D2, and the solder-paste 172 in an oven 221. This heating and cooling can solidify the solder-paste 172. This can solder and electrically couple the electrical connections 211 to the lower circuit board 11L and to the upper circuit board 11U.

DEFINITIONS

The following definitions, including plurals of the same, apply throughout this patent application.

As used herein, "directly soldered", "electrically-coupled directly by traces", and other similar phrases mean a rigid, solid electrical connection between the devices. If a flexible wire forms the electrical connection between the devices, then these devices are not directly soldered or electrically-coupled directly by traces.

As used herein, phrases referring to relative voltage, including increased voltage, lower voltage, lowest voltage, higher voltage, and highest voltage, mean the absolute value of the voltage.

As used herein, the term "parallel" means exactly parallel; parallel within normal manufacturing tolerances; or almost exactly parallel, such that any deviation from exactly parallel would have negligible effect for ordinary use of the device.

As used herein, the term "perpendicular" means exactly perpendicular; perpendicular within normal manufacturing tolerances; or almost exactly perpendicular, such that any deviation from exactly perpendicular would have negligible effect for ordinary use of the device.

As used herein, the same direction means exactly the same; the same within normal manufacturing tolerances; or almost exactly the same, such that any deviation from exactly the same would have negligible effect for ordinary use of the device.

As used herein, the term "wire" is distinguished from a "trace" as follows. A trace is mounted directly on the circuit board and adjoins the circuit board along its entire length. In contrast, at least a portion of a wire is spaced apart from the circuit board 11. A trace does not flex independent of the circuit board 11; but a wire can flex independent of the circuit board. A trace can have an exposed metal face along its entire length. A wire can be encircled by an electrically insulative coating along a majority of a length of the wire.

As used herein, the terms "on", "located on", "located at", and "located over" mean located directly on or located over with some other solid material between. The terms "located directly on", "adjoin", "adjoins", and "adjoining" mean direct and immediate contact.

As used herein, the term "kV" means kilovolts.

As used herein, the term "x-ray tube" is not limited to tubular/cylindrical shaped devices. The term "tube" is used because this is the standard term used for x-ray emitting devices.

The terms "top" and "bottom" are used herein as relative terms to the orientation of the figures.

DETAILED DESCRIPTION

A high voltage power supply can provide high voltage (e.g. ≥1 kV, ≥10 kV, or ≥50 kV) to an x-ray tube or to other devices. It can be helpful for the power supply to be compact. It can be helpful for electronic components on the power supply to be shielded, to reduce arcing failure. The power supplies herein can satisfy these needs.

Figure 1:
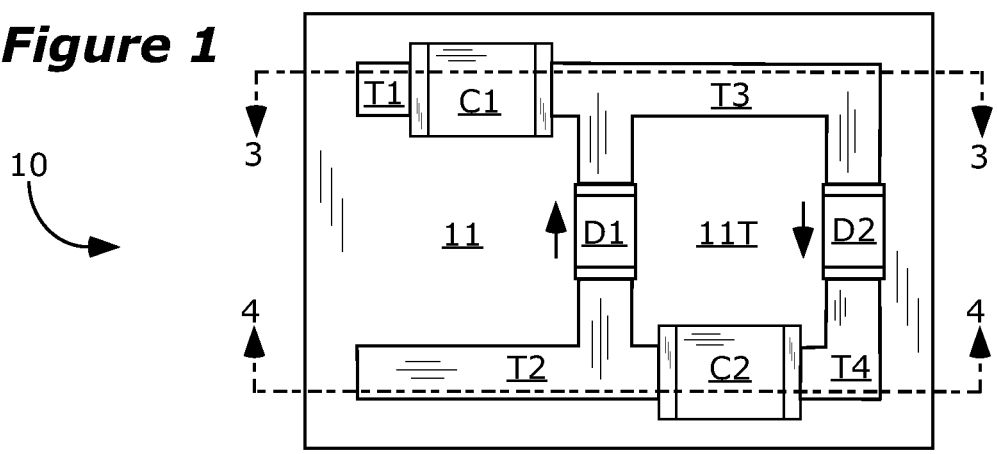
FIG. 1 is a top-view of a stage 10 of a power supply with electronic components C1, C2, D1, D2 on a top-side 11T of a circuit board 11.

The power supply can include multiple stages. Two such stages 10 and 20, which can be used alternately in a stack, are illustrated in FIGS. 1-2. These stages 10 and 20 can be mirror images of each other. Thus, an output (T3 and T4) of one stage 10 can align with an input (T1 and T2, respectively) of the other stage 20.

A power supply 30 with these stages 10 and 20 in a stack is illustrated in FIGS. 3-4. A direction from input (T1 and T2) to output (T3 and T4) of each stage 10 or 20 can be parallel and opposite with respect to adjacent stages 20 or 10. Thus, these stages 10 and 20 can be combined in a compact arrangement. Four of these stages 10 and 20 are illustrated in FIG. 3; but the invention can include more or less than four stages. The invention can include an odd number of stages.

These multiple stages 10 and 20 can be configured to multiply an input voltage to provide a larger output bias voltage. Each stage 10 or 20 can include electronic components C1, C2, D1, D2 on a top-side 11T of a circuit board 11. Electronic components C1 and C2 can be capacitors. Electronic components D1 and D2 can be diodes.

Each stage can have an input (T1 and T2) and an output (T3 and T4). Each stage can be configured to increase voltage from the input (T1 and T2) to the output (T3 and T4). For example, a Cockcroft-Walton circuit can be used as shown.

The output (T3 and T4) of each stage 10 or 20, except for a highest-voltage-stage HS, can be electrically coupled to the input (T1 and T2) of a higher voltage stage. The output (T3 and T4) of each stage 10 or 20, except for a highest-voltage-stage HS, can be electrically coupled to a high voltage device, such as an x-ray tube 41.

The input (T1 and T2) of each stage 10 or 20, except for a lowest-voltage-stage LS, can be electrically coupled to the output (T3 and T4) of a lower voltage stage. The input (T1 and T2) of the lowest-voltage-stage LS can be electrically coupled to an alternating current source 31.

In each stage 10 and 20, the electronic components C1, C2, D1, D2 can be directly soldered to the top-side 11T of the circuit board 11 for that stage. In each stage, except for the highest-voltage-stage HS, the electronic components C1, C2, D1, D2 can be directly soldered to a bottom-side 11B of the circuit board 11 of the higher voltage stage. The bottom-side 11B of each circuit board 11 can be opposite of the top-side 11T.

A circuit board (final circuit board 11F) can be placed on the highest-voltage-stage HS. Thus, the entire power supply 30 can be sandwiched between the circuit board 11 for the lowest-voltage-stage LS and the final circuit board 11F.

The final circuit board 11F can have the same configuration as one of the multiple stages 10 or 20 in the stack. A bottom-side 11B of the final circuit board 11F can be directly soldered to one, two, or some electronic components C1, C2, D1, and D2 on the top-side 11T of the highest-voltage-stage HS. A top-side 11T of the final circuit board 11F can be electrically coupled to a high voltage device, such as x-ray tube 41.

Illustrated in FIG. 5 is a stage 50, similar to stages 10 and 20. A power supply 60, with repeated stages 50 in a stack is illustrated in FIGS. 6-7. Power supply 60 is like power supply 30, except that the direction from input (T1 and T2) to output (T3 and T4) of every stage 50 is parallel and the same direction with respect to adjacent stages 50. All stages 50 in power supply 60 can have the same configuration and shape for easier manufacturing.

Illustrated in FIG. 8 is a stage 80, similar to stages 10 and 20. A power supply 90, with repeated stages 80 in a stack is illustrated in FIG. 9. Power supply 90 is like power supplies 30 and 60, except that the direction from input (T1 and T2) to output (T3 and T4) of every stage 80 is perpendicular to the direction from input (T1 and T2) to output (T3 and T4) of adjacent stages 80. This perpendicular arrangement can reduce undesired noise interference of each stage 80 with respect to other stages 80. All stages 80 in power supply 90 can have the same configuration and shape for easier manufacturing.

The output (T3 and T4), of the highest-voltage-stage HS of power supply 90, can be electrically coupled to a high voltage device, such as an x-ray tube 91. An alternating current source can provide alternating current to the input (T1 and T2) of the lowest-voltage-stage LS.

As illustrated in FIGS. 3, 4, 6, 7, and 9, the output (T3 and T4) of each stage, except for the output (T3 and T4) of the highest-voltage-stage HS, can be electrically coupled to the input (T1 and T2) of the higher voltage stage by a trace through the circuit board 11 of the higher voltage stage. The trace through the circuit board 11 of the higher voltage stage can be from a bottom-side 11B to a top-side 11T of the circuit board 11 of the higher voltage stage. This trace through the circuit board 11 can be embedded in the circuit board 11 to reduce the risk of arcing failure at edges of the circuit board 11.

Due to the size difference between different types of electronic components, further space saving can be achieved by sandwiching different types of electronic components between different pairs of circuit boards 11.

A power supply 120, illustrated in FIGS. 12-13, includes multiple stages 100 (see FIGS. 10-11). Power supply 120 includes electronic components C1, C2, D1, D2 in a circuit for generation of a bias voltage.

Power supply 120 comprises the three circuit boards 11, including a middle circuit board 11M sandwiched between a lower circuit board LB and an upper circuit board 11U. The electronic components C1, C2, D1, and D2 include a first group C1 and C2 and a second group D1 and D2.

The second group D1 and D2, mounted on the top-side 11T of the middle circuit board 11M, is illustrated in FIG. 10. The first group C1 and C2, mounted on the bottom-side 11B of the middle circuit board 11M, is illustrated in FIG. 11. Traces T1, T2, T3, and T4 are mounted on the top-side 11T of the middle circuit board 11M, but could also be mounted on the bottom-side 11B of the middle circuit board 11M. Two stages S1 and S2 of a Cockcroft-Walton voltage multiplier are mounted on the middle circuit board 11M in FIGS. 10-11, but there can be more stages or fewer stages than two.

The first group C1 and C2 can be sandwiched between and directly soldered to the lower circuit board LB and to the middle circuit board 11M. The second group D1 and D2 can be sandwiched between and directly soldered to the upper circuit board 11U and the middle circuit board 11M. Traces T1, T2, T3, and T4 can pass through the middle circuit board 11M from the bottom-side 11B to the top-side 11T to electrically couple the first group C1 and C2 to the second group D1 and D2. Every electronic component C1, C2, D1, D2 can be electrically coupled to a trace that passes through the middle circuit board 11M from the bottom-side 11B to the top-side 11T.

As illustrated in FIGS. 12-13, the first group C1 and C2 can be capacitors. There can be no diodes sandwiched between the lower circuit board LB and the middle circuit board 11M.

The second group D1 and D2 can be diodes. There can be no capacitors sandwiched between the upper circuit board 11U and the middle circuit board 11M. This is a more compact design.

Input connections T1 and output connections Tf can extend from the electronic components, through the lower circuit board LB, the upper circuit board 11U, or both, to an outer face. These input connections T1 and output connections Tf can allow connection to another stage, to an alternating current source, or to a high voltage device.

As illustrated in FIG. 14, power supply 140 includes electronic components C1, C2, D1, D2 configured to multiply an input (T1 and T2) voltage to provide a larger output (T3 and T4) bias voltage. The electronic components C1, C2, D1, and D2 are sandwiched between and adjoin a pair of circuit boards 11. The electronic components C1, C2, D1, D2 and the pair of circuit boards 11 are sandwiched between a pair of metal sheets 141.

The metal sheets 141 can improve shaping of electrical field gradients. The metal sheets 141 can also block electronic noise between the power supply 140 and other electric devices. The metal sheets 141 can be a ground plane.

Each circuit board 11 can adjoin one of the metal sheets 141. Each metal sheet 141 can cover all or a major portion of the adjoining circuit board 11, which can improve shaping of electrical field gradients and blocking electronic of noise. For example, an area of each metal sheet can be ≥70%, ≥90%, or ≥95% of an area of the adjoining circuit board 11.

An example material of the metal sheets 141 is copper. For example, each metal sheet 141 can comprise ≥70, ≥90, or ≥95 mass percent copper.

One, some, or all of the following twelve characteristics can apply to any of the power supplies and methods described herein:

(1) A longitudinal axis of the electronic components C1, C2, D1, D2 can be parallel to a face of the circuit boards 11 to which they are mounted (to improve stability and manufacturability).

(2) The entire circuit for generation of the bias voltage can consist of the electronic components C1, C2, D1, D2 and traces T1, T2, T3, and T4.

(3) All of the electronic components C1, C2, D1, D2 can be electrically-coupled directly to adjacent electronic components C1, C2, D1, D2 in the circuit by traces T1, T2, T3, and T4.

(4) All of the electronic components C1, C2, D1, D2 can be entirely enclosed between circuit boards.

(5) A shape of a side of the electronic components C1, C2, D1, D2, between an input can be rectangular.

(6) The circuit board 11 for each stage can be separate from, and not touch, the circuit board(s) 11 of other stage(s) in the stack.

(7) A Cockcroft-Walton voltage multiplier is illustrated in the figures. Other voltage multiplier circuits can be similarly arranged as described herein.

(8) Four traces T1, T2, T3, and T4 are usually illustrated and listed for each stage. This is typical for a Cockcroft-Walton voltage multiplier. Two traces T1 and T2 are shown in FIGS. 18-20. The term "traces" includes other numbers of traces. The term "traces" is not limited to four or two.

(9) A high voltage device can be electrically-coupled to any power supply described herein. The high voltage device can be an x-ray tube 41 or 91, as shown in FIGS. 4 and 9. A transmission target x-ray tube 41 is illustrated in FIG. 4. A side-window, reflection target x-ray tube 91 is illustrated in FIG. 9. Either x-ray tube 41 or 91 may be electrically-coupled to any power supply described herein.

(10) The x-ray tubes 41 and 91 can include a cathode 42 and an anode 49. The cathode 42 and the anode 49 can be electrically insulated from each other by an enclosure 45.

(11) A large voltage between the cathode 42 and the anode 49 of the x-ray tube 41, and sometimes a heated filament 43, can cause electrons in an electron beam 44 to emit from the cathode 42 to the anode 49.

(12) The anode 49 can include a target material 46. The target material 46 can generate x-rays 48 in response to impinging electrons from the cathode 42. The x-rays 48 can emit through an x-ray window 47 and out of the x-ray tube 41.

Method

A method of making a high-voltage power supply can include some or all of the following steps. These steps can be performed in the order step 1, step 2, step 3, then step 4. Step 1 can be performed in the order of (a) through (f), as shown below. Some of the steps can be performed simultaneously unless explicitly noted otherwise in the claims. The power supply can have properties as described above. Any additional description of properties of the power supply in the method below, not described above, are applicable to the above described power supply.

Steps in the method can include some or all of the following:

Step 1:
(a) providing a lower circuit board 11L with traces T1, T2, T3, and T4 (FIG. 15);
(b) applying a lower solder mask 161 on the lower circuit board 11L with openings 162 aligned with the traces T1, T2, T3, and T4 of the lower circuit board 11L (FIG. 16);
(c) applying solder-paste 172 on the traces T1, T2, T3, and T4 of the lower circuit board 11L at the openings 162 in the lower solder mask 161 (FIG. 17, this step can also include removing the lower solder mask 161);
(d) providing an upper circuit board 11U with traces T1 and T2 (FIG. 18);
(e) applying an upper solder mask 191 on the upper circuit board 11U with openings 162 aligned with the traces T1 and T2 of the upper circuit board 11U (FIG. 19);
(f) applying solder-paste 172 on the traces T1 and T2 of the upper circuit board 11U at openings 162 in the upper solder mask 191 (FIG. 20, this step can also include removing the upper solder mask 191);

step 2: placing electronic components C1, C2, D1, D2 on the lower circuit board 11L, the electronic components C1, C2, D1, D2 having electrical connections 211, with at least some of the electrical connections 211 of the electronic components C1, C2, D1, D2 placed on the solder-paste 172 of the lower circuit board 11L (FIG. 21);

step 3: placing the upper circuit board 11U on the electronic components C1, C2, D1, D2 with the solder-paste 172 of the upper circuit board 11U on at least some of the electrical connections 211 of the electronic components C1, C2, D1, D2 (FIG. 22);

step 4: heating and cooling (e.g. in oven 221) the circuit boards 11 and the electronic components C1, C2, D1, D2 to solidify the solder-paste 172 to solder and to electrically couple the lower circuit board 11L to at least some of the electrical connections 211 of the electronic components C1, C2, D1, D2 and to electrically couple the upper circuit board 11U to at least some of the electrical connections 211 of the electronic components C1, C2, D1, D2.

In step 2, pick and place board loading may be used to place the electronic components C1, C2, D1, D2 on the lower circuit board 11L.

In step 4, the lower circuit board 11L, the upper circuit board 11U, the electronic components C1, C2, D1, D2, and the solder-paste 172 can be simultaneously heated and cooled to solidify the solder-paste 172 to solder.

Additional circuit boards and electronic components can be processed similarly to build a larger stack of stages, such as those shown in FIGS. 3-4.

What is claimed is:

1. An x-ray source comprising:
an x-ray tube electrically-coupled to a power supply;
the power supply includes multiple stages, in a stack, configured to multiply an input voltage to provide a larger output bias voltage;
each stage (a) includes electronic components on a top-side of a circuit board, (b) has an input and an output, and (c) is configured to increase voltage from the input to the output;
the circuit board for each stage is separate from the circuit boards of other stages in the stack;
the output of each stage, except for a highest-voltage-stage, is electrically coupled to the input of a higher voltage stage;
the input of each stage, except for a lowest-voltage-stage, is electrically coupled to the output of a lower voltage stage;
in each stage the electronic components are directly soldered to the top-side of the circuit board for that stage; and
in each stage, except for the highest-voltage-stage, the electronic components are directly soldered to a bottom-side of the circuit board of the higher voltage stage, the bottom-side of each circuit board being opposite of the top-side.

2. The x-ray source of claim 1, wherein a direction from input to output of each stage is perpendicular to the direction from input to output of any adjacent stage.

3. The x-ray source of claim 1, wherein a direction from input to output of each stage is parallel and opposite with respect to the direction from input to output of any adjacent stage.

4. The x-ray source of claim 1, wherein a direction from input to output of all stages is the same with respect to each other.

5. The x-ray source of claim 1, wherein a longitudinal axis of each of the electronic components is parallel to the top-side and to the bottom-side of the circuit boards to which they are directly soldered.

6. The x-ray source of claim 1, wherein the electronic components are electrically-coupled directly to adjacent electronic components in the circuit by traces.

7. The x-ray source of claim 1, wherein the output of each stage, except for the output of the highest-voltage-stage, is electrically coupled to the input of the higher voltage stage by a trace through the circuit board of the higher voltage stage.

8. The x-ray source of claim 7, wherein the trace through the circuit board of the higher voltage stage is from a bottom-side to a top-side of the circuit board of the higher voltage stage.

9. The x-ray source of claim 1, further comprising an alternating current source configured to provide alternating current to the input of the lowest-voltage-stage.

10. The x-ray source of claim 1, wherein a shape of a side of the electronic components, between an input and an output, is rectangular.

11. An x-ray source comprising:
an x-ray tube electrically-coupled to a power supply;
the power supply includes three circuit boards and electronic components;
the three circuit boards include a middle circuit board sandwiched between a lower circuit board and an upper circuit board;
the electronic components are in a circuit for generation of a bias voltage, and include a first group and a second group;
the first group is sandwiched between and directly soldered to the lower circuit board and the middle circuit board; and
the second group is sandwiched between and directly soldered to the upper circuit board and the middle circuit board.

12. The x-ray source of claim 11, wherein traces pass through the middle circuit board to electrically couple the first group to the second group.

13. The x-ray source of claim 12, wherein every electronic component is electrically coupled to a trace that passes through the middle circuit board.

14. The x-ray source of claim 11, wherein:
the first group are capacitors;
no diodes are sandwiched between the lower circuit board and the middle circuit board;
the second group are diodes; and
no capacitors are sandwiched between the upper circuit board and the middle circuit board.

15. The x-ray source of claim 11, wherein a longitudinal axis of the electronic components is parallel to a face of the circuit boards to which they are mounted.

16. The x-ray source of claim 11, wherein the circuit consists of the electronic components and traces.

17. The x-ray source of claim 11, wherein all of the electronic components are electrically-coupled directly to adjacent electronic components in the circuit by traces.

18. The x-ray source of claim 11, wherein all of the electronic components are entirely enclosed between the lower circuit board and the upper circuit board.

19. The x-ray source of claim 11, wherein a shape of a side of the electronic components, between an input and an output, is rectangular.

20. An x-ray source comprising:
an x-ray tube electrically-coupled to a power supply;
the power supply includes electronic components configured to multiply an input voltage to provide a larger output bias voltage;
the electronic components are sandwiched between and adjoin a pair of circuit boards;
the electronic components and the pair of circuit boards are sandwiched between a pair of metal sheets, each circuit board adjoins one of the metal sheets.

* * * * *